(12) United States Patent
Mason et al.

(10) Patent No.: US 8,864,183 B1
(45) Date of Patent: Oct. 21, 2014

(54) MECHANISM TO LATCH A COVER CLOSED (75) Inventors: Todd M. Mason, Livermore, CA (US);
John D. Eales, Pleasant Hill, CA (US);
William Robert Huth, San Mateo, CA (US)

(73) Assignee: Cisco Technology, Inc., San Jose, CA (US)

( * ) Notice: Subject to any disclaimer, the term of this patent is extended or adjusted under 35 U.S.C. 154(b) by 532 days.

(21) Appl. No.: 13/191,862

(22) Filed: Jul. 27, 2011

(51) Int. Cl.
*E05C 19/00* (2006.01)

(52) U.S. Cl.
USPC .......................... 292/1; 292/150; 292/DIG. 37

(58) Field of Classification Search
USPC ............. 292/1, 137, 138, 140, 141, 150, 152, 292/341.17, 341.15
See application file for complete search history.

(56) References Cited

U.S. PATENT DOCUMENTS

| | | | |
|---|---|---|---|
| 5,465,191 A * | 11/1995 | Nomura et al. .......... 361/679.27 |
| 5,743,606 A | 4/1998 | Scholder ................... 312/223.2 |
| 5,918,956 A | 7/1999 | Scholder .................... 312/223.2 |
| 6,068,307 A * | 5/2000 | Murphy ....................... 292/302 |
| 6,351,379 B1 * | 2/2002 | Cheng ..................... 361/679.33 |
| 6,711,009 B2 | 3/2004 | Lee et al. ....................... 361/683 |
| 6,795,307 B2 | 9/2004 | Arbogast et al. .............. 361/683 |
| 6,935,661 B1 * | 8/2005 | Farnsworth et al. .......... 292/162 |
| 8,360,447 B2 * | 1/2013 | Knoppers .................... 280/79.3 |
| 2008/0217274 A1 * | 9/2008 | Curnalia et al. .............. 211/183 |

\* cited by examiner

*Primary Examiner* — Mark Williams
(74) *Attorney, Agent, or Firm* — Brinks Gilson & Lione (57) ABSTRACT

A latching apparatus includes a catch and a pin to maintain a chassis in a closed configuration. The catch is coupled to a first chassis panel and movable relative to the pin that is coupled to a second chassis panel. In response to relative movement between the catch and the pin along a first axis, a first portion of the pin is positioned within an opening of the catch to maintain the chassis closed. In response to relative movement between the catch and the pin, the catch opening is positioned around a second portion of the pin to define an unlatched position. Whereas the closed configuration inhibits relative movement between the first and second chassis portions, the unlatched position permits relative movement therebetween for separation between the first chassis panel and the second chassis panel.

17 Claims, 6 Drawing Sheets

MECHANISM TO LATCH A COVER CLOSED

FIELD

The present disclosure relates generally to a top cover of an electrical computer system, which can be attached to a base frame of the electrical computer system.

BACKGROUND

Electrical computer systems, such as computer servers, routers, switches, blade servers, or any other computing devices, are capable of being repaired or upgraded by an end user. An electrical computer system generally includes a top cover and a base frame which together define a chassis of the electrical computer system. To repair or upgrade the electrical computer system, the end user typically opens the electrical computer system by removing the top cover from the base frame in order to gain internal access to the base frame, which typically has serviceable or upgradable components. After the repair or upgrade, the end user closes the electrical computer system by reinstalling the top cover to the base frame. However, conventional chassis designs are difficult to efficiently and quickly detach and reattach the top cover to the base frame. For instance, it is common for the top cover to be attached to the base frame with screws, and thus the end user, such as a service technician, must use hand tools to remove and reinstall the screws when opening and closing the electrical computer system. With a variety of electrical computer system configurations, the service technician must be equipped with numerous hand tools required to remove the different types of fasteners in order to open and close various electrical computer system. Furthermore, the use of screws and hand tools to open and close the electrical computer system increases the risk of damage to the electrical computer system when the hand tools and screws are dropped into the electrical computer system.

Thus, it is desirable to provide an electrical computer system that has a top cover that can be efficiently and quickly detached and reattached to the base frame.

DETAILED DESCRIPTION OF EXAMPLE EMBODIMENTS

Overview

In one embodiment, an apparatus can include a latching catch and a latching pin to maintain first and second chassis panels of a chassis in a closed configuration. The latching catch can be coupled to a first chassis panel, such as, e.g., a cover of an electrical computer system. The latching pin can be attached to a second chassis panel, such as, e.g., a base frame of an electrical computer system. In response to relative movement between the latching catch and the latching pin along a first axis, a first cross-sectional area portion of the latching pin is positioned within an opening of the latching catch to define a latched position. At the latched position, relative movement between the first and second chassis panels can be inhibited so that the chassis is maintained in the closed configuration. In response to relative movement between the latching catch and the latching pin along a second axis, the opening of the latching catch is positioned around a smaller second cross-sectional area portion of the latching pin to define an unlatched position. At the unlatched position, relative movement between the latching catch and the latching pin is permitted along the first axis and the first chassis panel and the second chassis panel are separable from one another.

In yet another embodiment, a method can include moving a latching catch relative to a latching pin along a first axis between a latched position and unlatched position. The latching catch can be coupled to a first chassis panel, such as, e.g., a cover. The latching pin can be coupled to a second chassis panel, such as, e.g., a base frame. In the latched position, a first cross-sectional area portion of the latching pin is positioned within an opening of the latching catch to inhibit movement between the first and second chassis panels. In the unlatched position, the opening of the latching catch is positioned around a smaller second cross-sectional area portion of the latching pin. To cause separation between the first chassis panel and the second chassis panel, the first chassis panel can be moved relative to the second chassis panel along a second axis. To couple the first chassis panel to the second chassis panel, the first chassis panel can be moved relative to the second chassis panel along the second axis such that the opening of the latching catch can receive the first cross-sectional area portion of the latching pin.

EXAMPLE EMBODIMENTS

Figure 1:
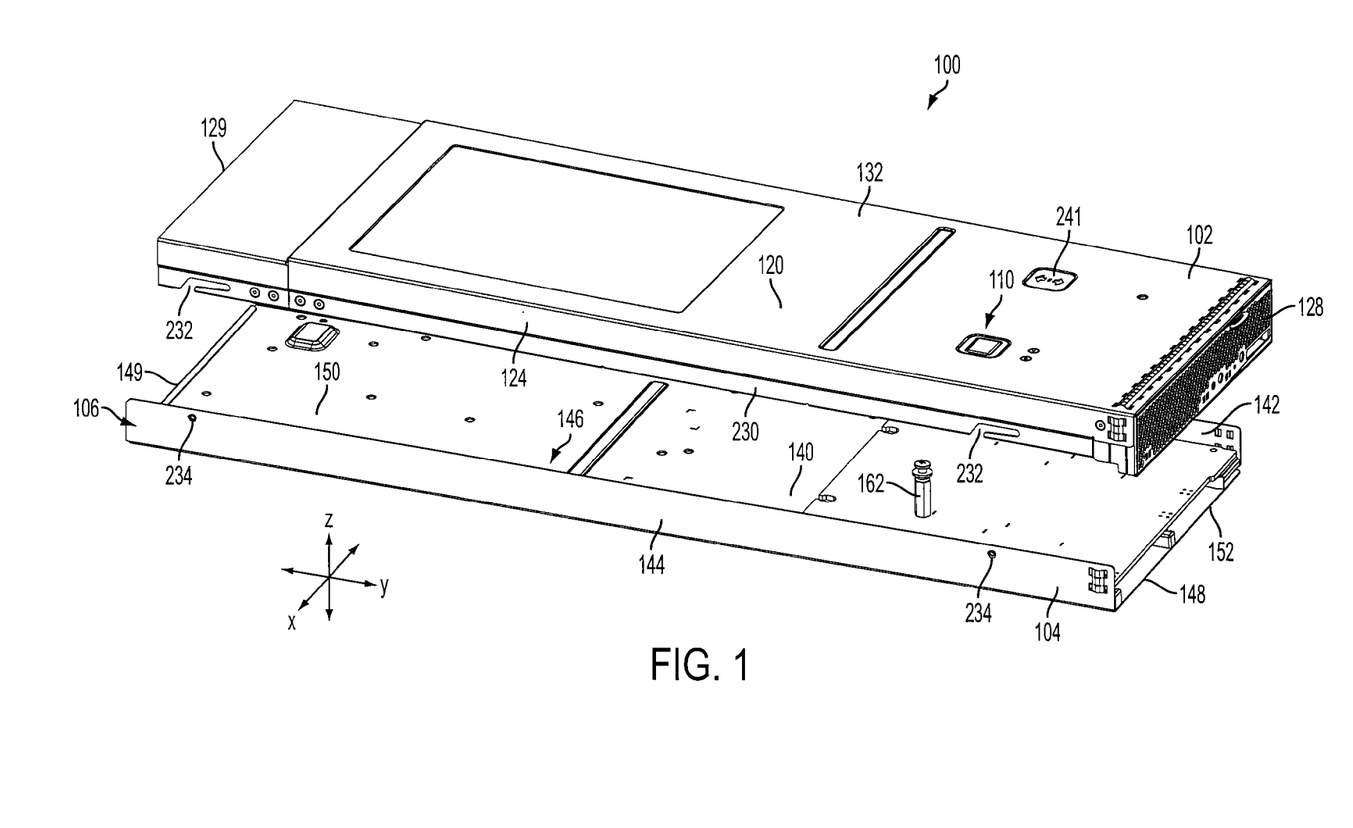
FIG. 1 is a top perspective view of an example electrical computer system having a cover removed from a base frame.

FIG. 1 illustrates a perspective view of one embodiment of an electrical computer system 100 including a plurality of chassis panels, such as a cover 102 and a base frame 104, which together define a chassis 106 of the electrical computer system 100. The chassis 106 can store and support various electronic components that are typically mounted to the base frame 104. The chassis 106 can have a closed configuration and an open configuration (shown in FIG. 1). In the closed configuration, the cover 102 can be placed over and coupled to the base frame 104 to conceal and protect the electronic components. In the open configuration, the cover 102 can be removed from its closed configuration on the base frame 104 so that access to the interior of the chassis 106 can be achieved, such as, e.g., to repair or upgrade electronic components. A latching apparatus 110 is provided to facilitate selective opening and closing of the chassis. In one example, the latching apparatus 110 can permit the cover 102 to be removed from the base frame 104, i.e., to open the chassis to the open configuration, without the use of tools and/or fasteners by an end user. To aid in the orientation of the components in the figures, a coordinate system is provided having a first axis x, a second axis y, and a third axis z, each different from one another, such as perpendicular to one another.

The electrical computer system 100 can be computer equipment such as a computer server, a router, a switch, a blade server, or any other computing device. One exemplary electrical computer system is the UCS Series 8440 M1 blade server, which is commercially available from Cisco Systems Inc. (San Jose, Calif.). The electrical computer system 100 can be a rack-mounted unit for a computer server rack, which is typically sized to dimensional standards as set forth by the Electronic Industries Alliance (EIA). The EIA has defined the mounting equipment in terms of a rack unit (RU), where each RU is 44.45 mm (1.75 inches) in height and 480 mm (19 inches) or 580 mm (23 inches) in width.

Figure 2:
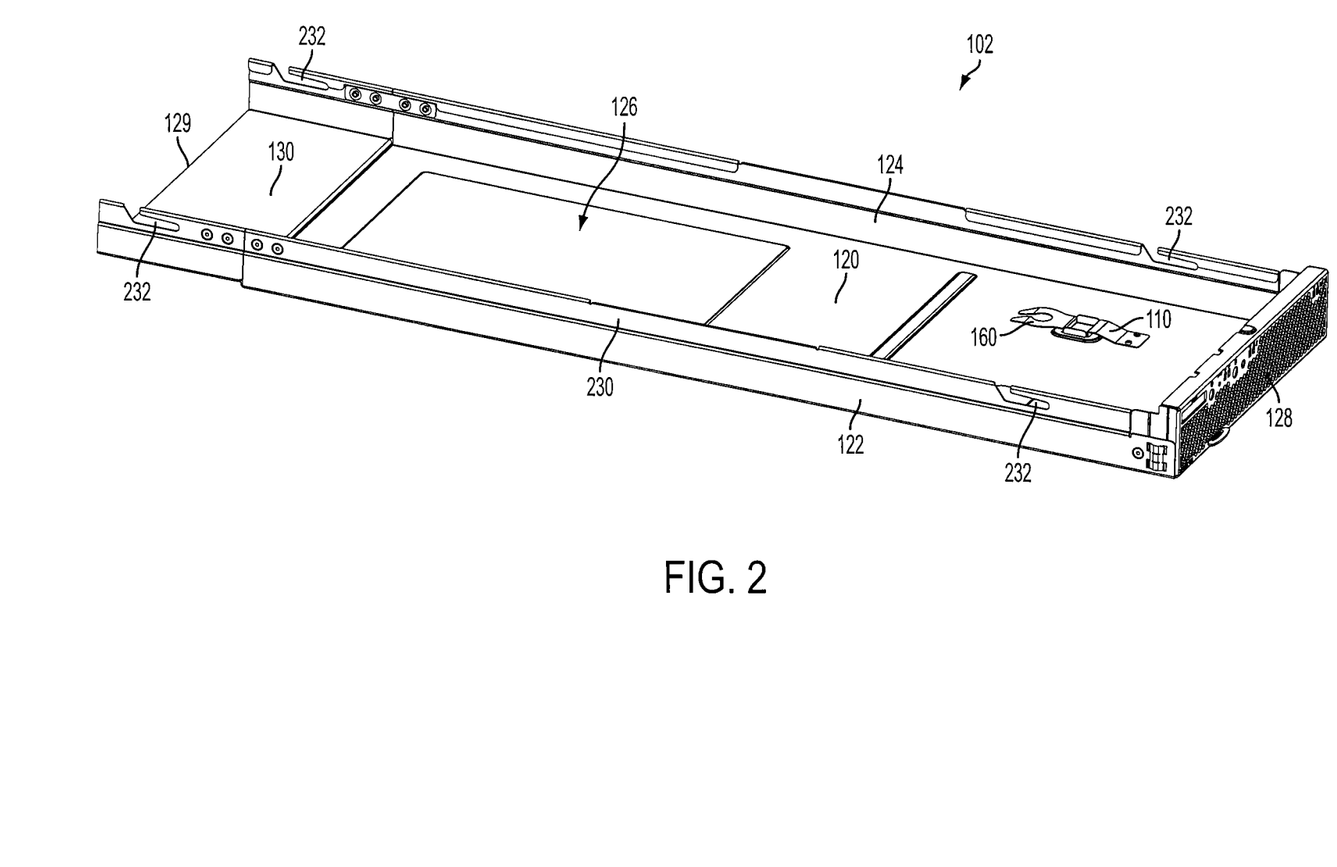
FIG. 2 is a bottom perspective view of an example cover for an electrical computer system.

In FIGS. 1-2, the cover 102 can include a cover body component 120. Although the body component 120 is shown to be a rectangular sheet, it is recognized that other shapes are possible as appreciated by those skilled in the art. A first sidewall 122 and a second sidewall 124 can depend from the body component 120 in a direction along the first axis x (i.e., downward direction in FIG. 1), generally approximately perpendicular to the body component 120, to form an interior 126 of the cover 102. The first and second sidewalls 122, 124 can be coupled to opposite ends of the body component 120, and can extend approximately parallel to one another in a direction along the second axis y (i.e., left-right direction in FIG. 1). A third sidewall 128 and a fourth sidewall (not shown) may also depend from the body component 120 in a direction along the first axis x, generally approximately perpendicular to the body component 120. The third sidewall 128 and the fourth sidewall can be coupled to opposite ends of the body component, and can extend approximately parallel to one another in a direction along the first axis x and approximately perpendicular to the first and second sidewalls 122, 124 in a direction along the third axis z. The third sidewall 128 may interconnect the first and second sidewalls 122, 124. The end 129 of the body component 120 where the fourth sidewall may be located can remain open, i.e., without a sidewall. The body component 120 includes an interior surface 130 to face toward the base frame 104 and an exterior surface 132 to face away from the base frame, in a direction opposite to the interior surface 130.

In FIG. 1, the base frame 104 can include a base body component 140. Although the body component 140 is shown to be a rectangular sheet, it is recognized that other shapes are possible as appreciated by those skilled in the art. A first sidewall 142 and a second sidewall 144 can depend from the body component 140 in a direction along the first axis x (upward direction in FIG. 1), generally approximately perpendicular to the body component 140, to form an interior 146 of the base frame 104. The first and second sidewalls 142, 144 can be coupled to opposite ends of the body component 140, and can extend approximately parallel to one another in a direction along the second axis y. A third side 148 and a fourth side 149, which may include sidewalls, can be disposed at opposite ends of the body component 140. The third and fourth sides 148, 149 can extend approximately parallel to one another in a direction along the first axis x and approximately perpendicular to the first and second sidewalls 142, 144 in a direction along the third axis z. The third side 148 and the fourth side 149 may interconnect the first and second sidewalls 142, 144. The body component 140 includes an interior surface 150 to face toward the cover 102 and an exterior surface 152 to face away from the cover, opposite to the interior surface 150.

Figure 3:
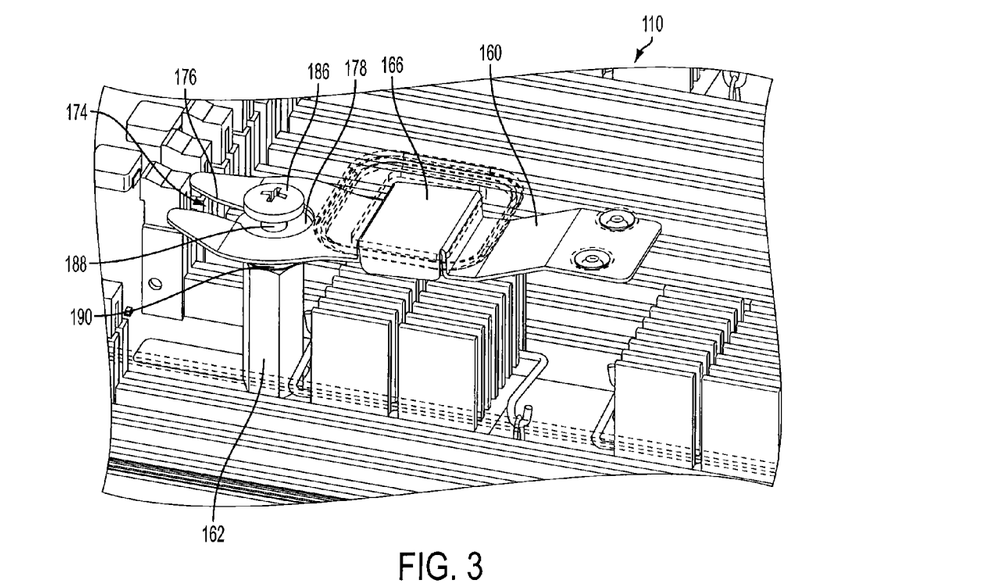
FIG. 3 is a top perspective view of an example latching apparatus for an electrical computer system.
Figure 10:
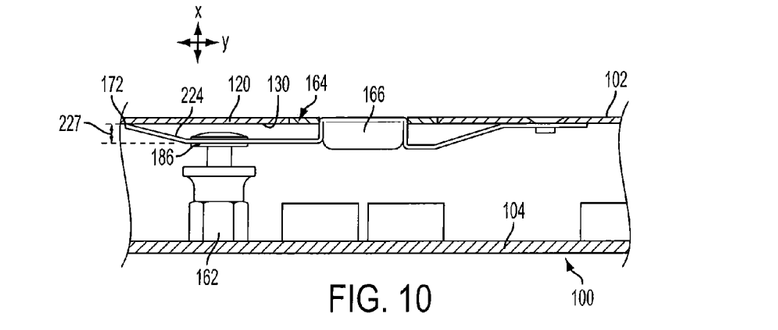
FIG. 10 is a partial cross-sectional side view of the latching catch in a latched position coupled to the latching pin of FIG. 9.
Figure 11:
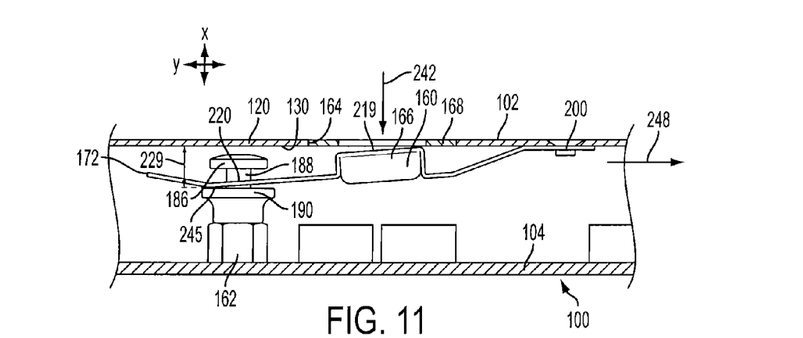
FIG. 11 is a partial cross-sectional side view of the latching catch moved to an unlatched position relative to the latching pin of FIG. 9.

FIG. 3 illustrates one example of the latching apparatus 110 including a latching catch 160 and a latching pin 162. The latching pin 162 can be oriented substantially perpendicular to the latching catch 160. The latching catch 160 is movable between a first position and a second position along the first axis x. In the first position, the latching catch 160 is positioned to couple with the latching pin 162 to define a latched position that maintains the chassis in the closed configuration, as illustrated in FIG. 10. That is, at this position, relative movement between the cover 102 and the base frame 104 in a direction along the second axis y is substantially inhibited. In the second position, the latching catch 160 is removed from the latching pin 162 to define an unlatched position, as illustrated in FIG. 11. That is, at this position, relative movement between the cover 102 and the base frame 104 in a direction along the second axis y is permitted. In one example, the latching catch 160 is coupled to the cover 102, whereas the latching pin 162 is coupled to the base frame 104, as shown in the figures. However, one modification is contemplated where the latching catch 160 is coupled to the base frame 104 and the latching pin 162 is coupled to the cover 102 as appreciated by those skilled in the art. The latching pin and the latching catch can be positioned along any portion of the chassis as can be appreciated by those skilled in the art. In one example, the latching catch 160 is coupled to the interior surface of the cover body portion 120 or along any of the cover sidewalls. It is recognized that more than one latching apparatus may be provided along different sidewalls or body portions of the cover and/or the base frame.

Figure 4:
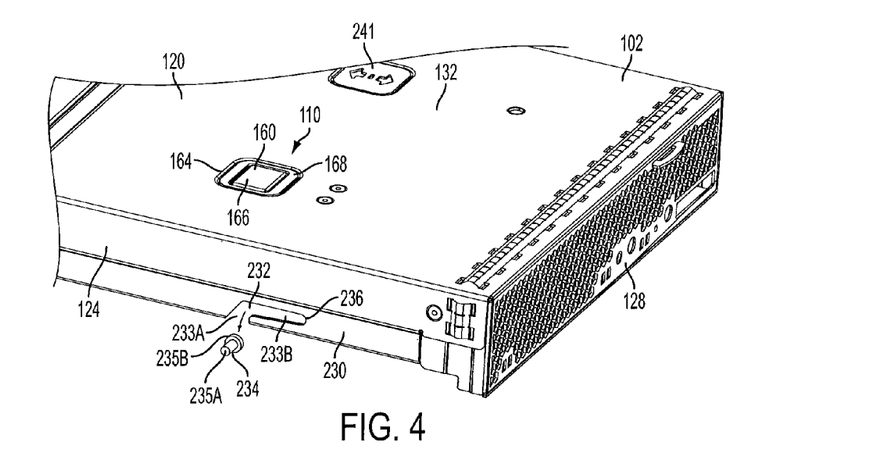
FIG. 4 is a top perspective view of an end of the cover of FIG. 2.

In FIG. 4, an access opening 164 can be formed in the wall of the cover body portion 120. The access opening 164 can permit external access to the latching catch 160 so that the end user can selectively move the latching catch 160 between the first and second positions. In other words, the end user can contact and apply a force directly to the latching catch 160 through the access opening 164 so that the latching catch 160 is moved from the first position to the second position, as described herein. In one example, the latching catch 160 includes an actuatable portion 166 sized to extend within the access opening 164 to facilitate contact with the latching catch. In another example, the access opening 164 is sized larger than the cross-section of the actuatable portion 166, and a border material 168, such as a flexible elastomer material or neoprene material, can extend inward from the edges of the access opening 164 to the outer edges of the actuatable portion 166. The inner edge of the border material can be shaped like the cross-section of the actuatable portion 166 so that the border material 168 can prevent dust, dirt, debris, or other unwanted materials from entering into the chassis when the cover is in the closed configuration.

Figure 5:
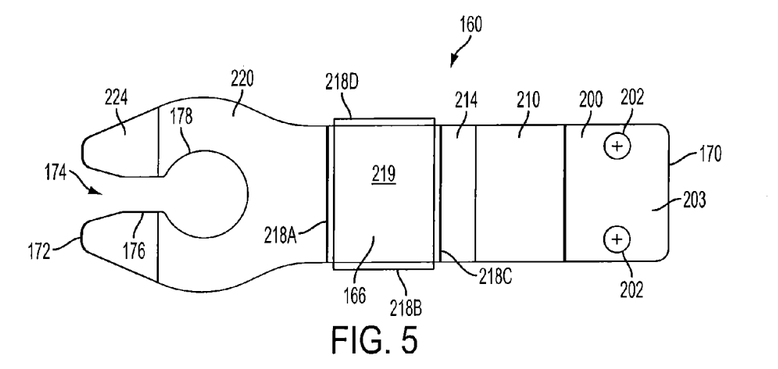
FIG. 5 is a top view of an example latching catch for a latching apparatus.
Figure 6:
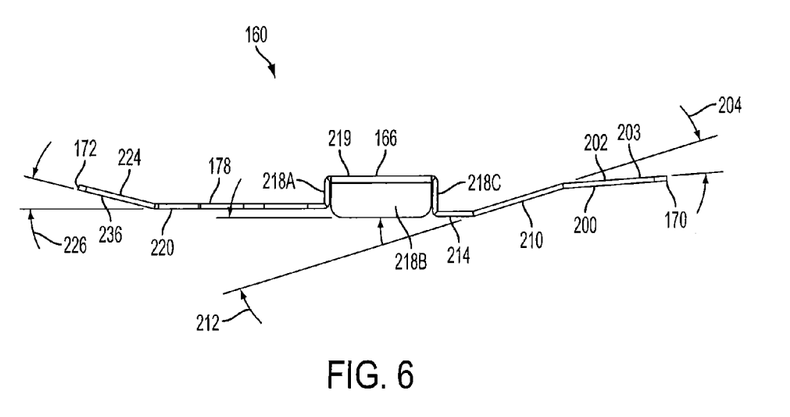
FIG. 6 is a side view of the latching catch of FIG. 5.

FIGS. 5-6 illustrate one example of the latching catch 160. The latching catch 160 can include a first end 170 and a second end 172. The latching catch can be made of various rigid but flexible materials used for electrical computer systems, such as, e.g., stainless steel or other metals or plastics, which can be machined, molded, punch pressed, or otherwise formed into the desired shape. The first end 170 can be fixedly attached to the cover 102 in a secured relationship by various attachment mechanisms, such as, e.g., adhesives, welding, soldering, and/or mechanical fasteners such as screws or rivets. The second end 172 can be a free end, i.e., can remain unattached to the cover, so that the second end 172 can be selectively moved and displaced relative to the first end along the first axis x. In this configuration, the latching catch 160 functions like a leaf-type spring. To this end, the latching catch 160 has a biasing force to maintain the latching catch 160 in the first position and thus the latched position as shown in FIG. 10. Application of a force greater than the biasing force can move the latching catch 160 to the second position and thus the unlatched position as shown in FIG. 11. The latching catch 160 can include an opening positioned between the first and second ends of the latching catch, such as an intermediate opening, to receive a portion of the latching pin. In one example, the opening is an end opening 174 formed at the second end 172. The end opening 174 may have a varied cross-section, such as, e.g., having at least a narrowed passage 176 leading to a relatively larger pin head receiving aperture 178. It is recognized that the latching catch can have biasing or spring arrangements other than the leaf-type arrangement described herein. For instance, the latching catch can be coupled to slide along one or more pins that have coiled springs coupled between the pins and the latching catch to bias the latching catch to the first position.

Figure 7:
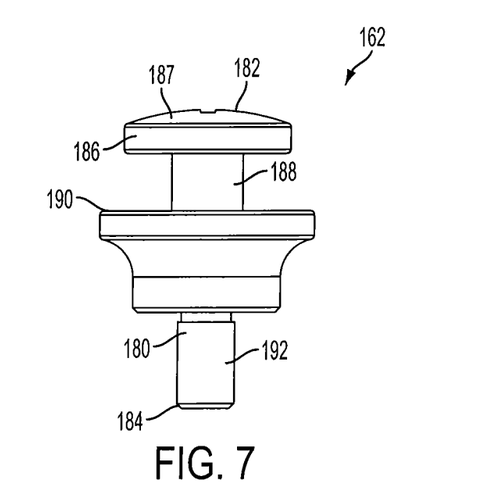
FIG. 7 is a side view of an example latching pin for a latching apparatus.
Figure 8:
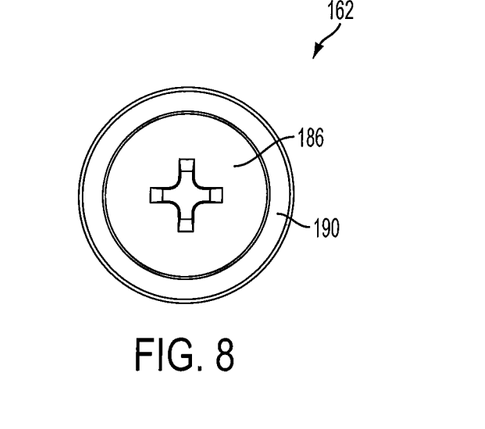
FIG. 8 is a top view of the latching pin of FIG. 7.

FIGS. 7-8 illustrate one example of the latching pin 162. The latching pin 162 can include a shaft body 180 having a first end 182 and a second end 184. The latching pin can be made of various materials used for electrical computer systems, such as, e.g., steel alloys or other metals or plastics, which can be machined, molded, or otherwise formed into the desired shape. The second end 184 can be fixedly attached to the base frame 104 in a secured relationship by various attachment mechanisms, such as, e.g., adhesives, welding, soldering, mechanical interference fit, or threaded engagement. The latching pin 162 can have a variable cross-section with different cross-sectional areas. The first end 182 can include a pin head 186 having a circumference sized to be received within the pin head receiving aperture 178 of the latching catch 160 when the latching catch is in the first position. The pin head 186 can have a disk shape. In one example, the pin head 186 may include an outer surface 187 that is tapered and/or rounded to facilitate slidable engagement between the latching pin and the latching catch. The pin head 186 can have a first cross-sectional area larger than a second cross-sectional area defined by an intermediate portion 188 of the shaft body 180, which is adjacent to the pin head 186. The first cross-sectional area of the pin head 186 can be larger than the narrowed passage 176 but sized to fit within the pin head receiving aperture 178 of the end opening 174 of the latching catch 160. The intermediate portion 188 can be sized to pass through the narrowed passage 176. To this end, when the latching catch 160 is deflected along the first axis x to a position such that the pin head receiving aperture 178 surrounds the intermediate portion 188, such as shown in FIG. 3, the latching catch 160 is in the second position and can move relative to the latching pin 162 in a direction along the second axis y. At this position, the intermediate portion 188 of the latching pin can pass through the narrowed passage 176 of the latching catch so that the cover can be removed from the base frame. It is contemplated that the pin head can be spring loaded. For example, the pin head is movable along the axis of the pin away from the cover during engagement with the latching catch, and can spring into position within the pin head receiving aperture.

The latching pin 162 may include a flange segment 190 to limit or stop the amount of displacement of the latching catch 160 along the first axis x. This arrangement can reduce the amount of stress and potential deformation at the first end 170 caused by the latching catch 160 moving beyond its yield point, as well as protecting components located at the base frame from being contacted by the movable latching catch. The flange segment 190 can be disposed axially away from the pin head 186 toward the second end 184. The flange segment 190 can have a third cross-sectional area larger than the second cross-sectional area of the intermediate portion 188 of the shaft body 180. The third cross-sectional area of the flange segment 190 can be as least as large as, and preferably larger than, the first cross-sectional of the pin head 186, as shown in FIG. 8. In one example, the end segment 192 of the shaft body 180 proximate the second end 184 may include a threaded portion for threaded engagement with the base frame as an exemplary attachment mechanism.

FIGS. 5-6 illustrate other aspects of the latching catch 160. For example, a first end segment 200 proximate the first end 170 of the latching catch 160 is configured for attachment with the cover 102 to form the spring portion of the latching catch 160. A first intermediate segment 210 can interconnect the first end segment 200 to the actuatable portion 166. A second intermediate segment 220 can interconnect a second end segment 224 with the actuatable portion 166. The second end segment 224 is configured to maintain the relative orientation between the pin head receiving aperture 178 of the end opening 174 of the latching catch 160 in the first position and the pin head 186 of the latching pin 162.

In one example, the first end segment 200 can include one or more fastener openings 202 that align with corresponding openings formed in the cover for receiving fasteners, such as, e.g., screws or rivets, therethrough. The confronting surface 203 of the first end segment 200 may lie parallel to the interior surface 130 of the cover 102 with which the first end segment 200 is in a confronting contact relationship. In one example, the confronting surface 203 of the first end segment 200 may be angled at a first angle 204, such as, e.g., up to about 15 degrees, preferably about 7-13 degrees, and more preferably about 13 degrees, relative to the interior surface 130 of the cover 102 prior to the attachment therebetween. This angled arrangement can enhance the biasing force of the spring portion of the latching catch 160 when coupled to the cover 102. Further, the biasing force can maintain the relative orientation between the pin head receiving aperture 178 of the end opening 174 of the latching catch 160 and the pin head 186 of the latching pin 162 when the latching catch 160 is in the first position, as shown in FIG. 10.

In FIGS. 5-6, the first intermediate segment 210 can lie contiguous with the first end segment 200. In one example, the first intermediate segment 210 may be angled at a second angle 212, such as, e.g., up to about 20 degrees, and preferably about 17 degrees, relative to the interior surface 130 of the cover 102 prior to the attachment therebetween. The first intermediate segment 210 can extend in a direction toward the actuatable portion 166, where an edge of the first intermediate segment 210 is attached to the base 214 of the actuatable portion 166. As shown, the base 214 can lie along the lowest plane relative to all of the segments 200, 210, 220, 224. The actuatable portion 166 can include a plurality of walls 218A, 218B, 218C, 218D. For example, the wall 218C can extend generally upward from the base 214, the walls 218B, 218D can extend downward from a protruding surface 219, and the wall 218A can extend downward to the adjacent segment. The protruding surface 219 can be coupled to the walls 218A-218D of the actuatable portion 166 can lie along the highest plane relative to all of the segments 200, 210, 220, 224. The actuatable portion 166 can extend through the access opening 164 of the cover 102 to position the protruding surface 219 approximately coplanar with the exterior surface 132 of the cover 102.

The second intermediate segment 220 can extend in a direction toward the second end 172 of the latching catch 160, generally perpendicular to the wall 218A and generally parallel to the protruding surface 219. The second intermediate segment 220 can lie along a plane disposed between the protruding surface 219 and the base 214. The pin head receiving aperture 178 can be formed in the second intermediate segment 220 of the latching catch 160. Depending on the relative size between the latching catch 160 and the pin head receiving aperture 178, the second intermediate segment 220 may be sized to extend laterally beyond the other segments, as shown in FIG. 5. This arrangement can provide a sufficient amount of material surrounding the pin head receiving aperture 178 to reduce the risk of deformation of the second intermediate segment 220 and/or the pin head receiving aperture 178 during normal use and operation.

The second end segment 224 can lie contiguous with the second intermediate segment 220 and is proximate the second end 172 of the latching catch 160. The second end segment 224 may be angled at a third angle 226, such as, e.g., up to about 16 degrees, and preferably about 14 degrees, relative to the second intermediate segment 220. Besides maintaining the orientation of the latching catch 160 relative to the pin head 186, the angled arrangement of the second end segment 224 can avoid potential catching or snagging between the latching catch 160 and the pin head 186 during movement of the latching catch along the second axis y toward the latching pin. To this end, when the second end segment 224 is angled, a smooth guiding contact surface may be provided when the second end segment 224 slidably engages the pin head 186, especially when the pin head is tapered and/or rounded. This arrangement can permit the pin head receiving aperture 178 of the latching catch 160 to easily receive the pin head 186. The biasing force of the latching catch 160 urges the second end 172 of the latching catch to move against the interior surface 130 of the cover 102. To this end, the third angle 226 of the second end segment 224 may be selected to maintain the latching catch in a spaced relationship with the interior surface 130 of the cover 102, as shown in FIG. 10. To this end, the second end segment 224 can facilitate maintaining the latching catch at a consistent and predictable position during movement of the cover.

Figure 9:
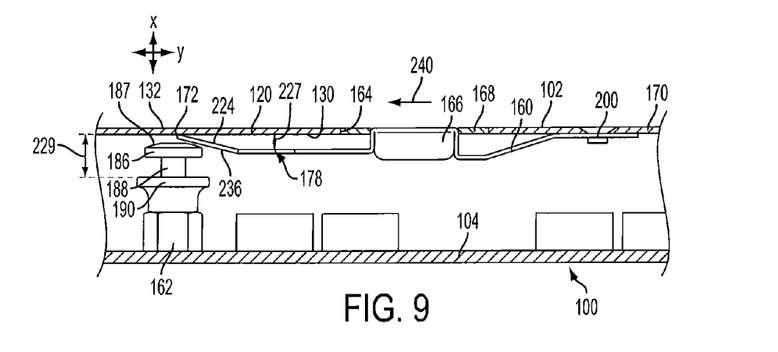
FIG. 9 is a partial cross-sectional side view of a latching catch coupled to a cover being moved in closer proximity to a latching pin coupled to a base frame.

According to FIGS. 9-11, the latching catch 160 can be positioned to remain in close proximity along the interior surface 130 of the cover 102. This arrangement provides clearance for the latching catch relative to the electronic components protruding upward from the base frame 104. To this end, the latching catch 160 is positioned relative to the cover 102 such that the pin head receiving aperture 178 of the latching catch 160 in the first position is spaced away from the interior surface 130 of the cover 102 by a first distance 227. To latch, the pin head 186 of the latching pin 162 is elevated above the base frame 104 such that the pin head 186 is spaced away from the interior surface 130 of the cover 102 by about the first distance 227. To limit the movement of the latching catch 160 to a pre-defined second position, the flange segment 190 can be positioned relative to the interior surface 130 of the cover 102 at a second distance 229, which is greater than the first distance 227. By fixing the first and second distances 227, 229 relative to the cover, the same first and second distances can be used regardless of the overall height of the chassis, i.e., 1RU, 2RU, 3RU, etc. In other words, the same latching apparatus dimensions and arrangement can be used during manufacturing and assembling of the electrical computer system with various heights of chassis. It is recognized that for greater chassis heights the shaft body of the latching pin 162 can be longer or the standoff to which the latching pin is attached can be adjusted so that the first distance 227 for the pin head 186 is maintained for the chassis regardless of the chassis height.

According FIGS. 1, 2, and 4, to facilitate the coupling between the cover 102 and the base frame 104 when the cover 102 is moving to the closed configuration, recessed portions 230 of the first and second sidewalls 122, 124 of the cover 102 can be recessed inwardly. Such recessed portions 230 can be for guiding the cover sidewalls 122, 124 within the corresponding first and second sidewalls 142, 144 of the base frame 104. When the recessed portions 230 of the first and second sidewalls 122, 124 are fitted inside of the first and second sidewalls 142, 144 of the base frame 104, relative movement between the cover in the closed configuration and the base frame along the third axis z is inhibited. One or more guiding slots 232 can be formed in the first and second sidewalls 122, 124 of the cover 102, for receiving corresponding stand-offs or protrusions 234 that extend inwardly, which are located on the first and second sidewalls 142, 144 of the base frame 104. Although four guiding slots 232 are shown in FIG. 2, it can be appreciated that less than four or more than four guiding slots may be provided. In one example, the guiding slots 232 are formed in the recessed portions 230 of the cover sidewalls.

The guiding slots 232 can have various configurations. In one example, each of the guiding slots 232 is L-shaped with a first segment 233A and a second segment 233B, as shown in FIG. 4. The first segment 233A can be oriented along the first axis x, such as, e.g., the vertical direction. A tapering edge can be formed along the first segment 233A to guide the protrusion toward the second segment 233B. The second segment 233B can be oriented along the second axis y, such as, e.g., the horizontal direction. In FIG. 4, the protrusion 234 can include a shaft portion 235A sized to fit within the guiding slot 232. In one example, the shaft portion 235A is sized to fit within the second segment 233B of the guiding slot 232 to inhibit relative movement between the cover 102 in the closed configuration and the base frame 104 along the first axis x. The protrusion 234 may also include a head portion 235B that is larger than the shaft portion 235A.

The operation of the latching apparatus 100 when the cover 102 is moved between the open and the closed configuration will now be described, with reference to all of the figures. The guiding slots 232, such as its first segment 233A, of the cover 102 can be aligned with the corresponding protrusions 234 of the base frame 104. The cover and the base frame are moved closer relative to one another along the first axis x such that the guiding slots 232 receive the corresponding protrusions 234. The cover 102 can then be moved relative to the base frame 104 in a first direction along the second axis y, represented by arrow 240, so that the protrusion 234 is moved farther within the guiding slot 232, such as the second segment 233B. As a result of such movement, the latching catch 160 is moved relatively closer to the latching pin 162, as shown in FIG. 9. As shown, the second end 172 of the latching catch 160 can be maintained in a position against the interior surface 130 of the cover 102. A confronting surface 236, i.e., the lower surface, of the second end segment 224 slidably engages the outer surface 187 of the pin head 186 of the latching pin 162. The end opening 174 of the latching catch 160 may receive a partial tip portion of the pin head 186. Sliding engagement between the pin head and the latching catch can cause axial compression of the latching catch. As a result, the latching catch 160 can bow, particularly bow toward the cover along the second intermediate segment 220 until the pin head receiving aperture snaps onto the pin head to return to its uncompressed axial configuration. The actuatable portion 166 may even move outward within the opening 164 during such axial compression. When the pin head receiving aperture 178 snaps onto the pin head 186, audible feedback is provided to the end user to indicate that the latching catch is in the latched position.

The cover 102 can then be moved relative to the base frame 104 along the second axis y until the latching catch 160 is coupled to the latching pin 162 in the latched position, as shown in FIG. 10. In one example, the end 236 of the second segment 233B of the guiding slot 232 shown in FIG. 4 can be selectively located to coordinate with the movement of the latching catch 160 to the latched position. To this end, as the protrusion 234 is moved farther within the second segment 233B of the guiding slot 232 in close proximity to, if not in a contacting relationship with, the end 236 of the second segment 233B, the latching catching 160 is moved to the latched position over the latching pin 162. At this position, the pin head receiving aperture 178 of the latching catch 160 receives the circumference of the pin head 186 of the latching pin 162. Here, until the latching catch 162 is moved to the second, unlatched position, the cover 102 can remain in the closed configuration, inhibited from movement along the first, second, and third axes x, y, z when coupled to the base frame 104.

In FIG. 11, the latching catch 160 is removed from the latching pin 162 to the second, unlatched position. The end user can place his or her palms along the sidewalls 122, 124 of the cover 102 in a manner to orient the thumbs along the exterior surface 132 of the cover. The latching apparatus 110 can be positioned relative to one of the sidewalls 122, 124 such that the thumb of the end user can be placed on the actuatable portion 166 to cause actuation thereof. A depression 241 can formed relative to the other of the sidewall 122, 124 of the cover to provide a gripping surface for the other thumb. The depression 241 may be frictionally enhanced with surface irregularities or with a layer of tacky substance such a neoprene. The end user can apply a force, represented by arrow 242, which is greater than the biasing force of the latching catch 160, such as, e.g., 2 pounds of force, directly to a portion of the latching catch 160, such as, e.g., the actuatable portion 166, through the opening 164. Under such force, the latching catch 160 can be then deflected along the first axis x, such as to pivot about the first end segment 200, to a position where the pin head receiving aperture 178 surrounds the intermediate portion 188 and no longer surrounds the pin head 186. The degree of deflection can be limited by providing the flange segment 190, which can be contacted by a contacting surface 245, such as the lower surface, of the second intermediate segment 220. This places the pin head receiving aperture 178 of the latching catch 160 around the intermediate portion 188 of the latching pin 162 so that the intermediate portion 188 can pass through the narrowed passage 176 of the latching catch 160. While maintaining the force 242, the end user can then move the combination of the cover 102 and the latching catch 160 relative to the latching pin 162 in a second direction along the second axis y, represented by arrow 248, opposite the first direction 240. After the second end 172 of the latching catch 160 has cleared the pin head 186 of the latching pin, the end user can remove the force 242, which allows the latching catch 160 to return to the first position. The end user then can continue to move the cover 102 to the open configuration away from the base frame 104 to a position such as shown in FIG. 1. To this end, the latching apparatus 110 can permit the cover 102 to be removed from the base frame 104, i.e., to open the chassis to the open configuration, without the use of tools and/or fasteners by an end user. However, it can be recognized by one skilled in the art that a tool can be used in place of the end user's hand to apply the force directly to a portion of the latching catch 160 through the opening 164. For example, the opening can be sized smaller, such as having a diameter up to 15 mm, in order to receive a tool, such as a screwdriver, which is operable to move the latching catch.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. An apparatus comprising:
   a latching catch to couple to a first chassis panel, the latching catch having a first end and a second end, and an opening formed therein between the first and second ends, the opening comprising a narrowed passage and a wider aperture; and
   a latching pin to couple to a second chassis panel, the latching pin including:
      a first cross-sectional area portion larger than a cross-sectional area of the narrowed passage and sized to be positioned within the wider aperture, and
      a second cross-sectional area portion smaller than the first cross-sectional area portion and sized to be positioned within the narrowed passage,
   wherein, in response to relative movement between the latching catch and the latching pin along a first axis, the latching catch is compressed by the latching pin towards the first chassis panel and the first cross-sectional area portion of the latching pin is positioned within the wider aperture to inhibit movement between the first and second chassis panels,
   wherein, in response to movement of the latching catch, along a second axis, away from the first panel and movement of the latching catch along the first axis, the second cross-sectional area portion of the latching pin passes from the wider aperture through the narrowed passage to allow for relative movement between the first chassis panel and the second chassis panel along the first axis.

2. The apparatus of claim 1, wherein the opening comprises an end opening formed at the second end of the latching catch.

3. The apparatus of claim 2, wherein the end opening of the latching catch is formed into adjacent first and second segments, the first segment and the second segment oriented relative to one another at an angle.

4. The apparatus of claim 1, wherein the latching catch is movable between a first position and a second position along the second axis, the latching catch having a spring portion to bias the latching catch in the first position.

5. The apparatus of claim 1, wherein the first axis is different from the second axis.

6. The apparatus of claim 1, wherein the latching pin comprises a third cross-sectional area portion positioned away from the first cross-sectional area portion, the third cross-sectional area portion having a cross-sectional area larger than the second cross-sectional area portion.

7. The apparatus of claim 1, wherein the first end of the latching catch is configured to resiliently couple to the first chassis panel and the second end of the latching catch is a free end that is movable relative to the first end in response to movement of the latching catch between first and second positions along the second axis.

8. The apparatus of claim 7, wherein the second end of the latching pin is configured to fixedly attach to the second chassis panel.

9. The apparatus of claim 8, wherein the latching catch comprises a first segment proximate the first end and a second segment contiguous with the first segment, wherein the first segment and the second segment are oriented relative to one another at an angle to increase a biasing force of the latching catch.

10. A system comprising:
a first chassis panel;
a second chassis panel, wherein the first chassis panel is capable of being coupled to the second chassis panel by a latching apparatus configured to selectively maintain the system in a closed configuration, the latching apparatus comprising:
a latching catch coupled to the first chassis panel, the latching catch having a first end and a second end, and an end opening formed therein at the second end, the end opening comprising a narrowed passage and a wider aperture, and
a latching pin attached the second chassis panel, the latching pin including:
a first cross-sectional area portion larger than a cross-sectional area of the narrowed passage, and
a smaller second cross-sectional area portion,
wherein, in response to relative movement between the latching catch and the latching pin along a first axis, the latching catch is compressible by the latching pin towards the first chassis panel to allow the first cross-sectional area portion of the latching pin to be positioned within the wider aperture of the latching catch to define a latched position so that the system is maintained in the closed configuration,
wherein, in response to relative movement between the latching catch and the latching pin along a second axis, the second end of the latching catch is movable away from the first chassis panel to allow the wider aperture of the latching catch to be positioned around the second cross-sectional area portion of the latching pin to define an unlatched position to allow for separation between the first chassis panel and the second chassis panel so that the system has an open configuration.

11. The system of claim 10, wherein the first chassis panel has an access opening formed therein, the latching catch having an actuatable portion sized to protrude through the access opening, wherein in response to application of a force to the actuatable portion the latching catch is movable between a first position and a second position along the second axis.

12. The system of claim 10, wherein the latching catch has a leaf spring arrangement, where the first end of the latching catch is fixedly attached to the first chassis panel, and the second end of the latching catch is a free end displaceable relative to the first end, wherein the latching catch is biased in a first position that is in close proximity to the first chassis panel.

13. The system of claim 12, wherein the latching pin and the latching catch are oriented relative to one another at a substantially perpendicular relationship, and the first cross-sectional area portion of the latching pin is positioned to be slidably received within the end opening of the latching catch.

14. The system of claim 12, wherein the end opening of the latching catch that is in the first position is positioned relative to the first chassis panel at a first distance, and the first cross-sectional area portion of the latching pin is positioned relative to the first chassis panel at about the first distance when the system has the closed configuration.

15. The system of claim 14, wherein the latching pin comprises a third cross-sectional area portion to limit the movement of the latching catch to a second position away from the first chassis panel, the third cross-sectional area portion positioned relative to the first chassis panel at a second distance greater than the first distance when the system has the closed configuration, the third cross-sectional area portion having a cross-sectional area larger than the second cross-sectional area portion.

16. The system of claim 15, wherein the latching catch comprises a first end segment proximate the first end, a second end segment proximate the second end, and an intermediate section therebetween, the first end segment oriented relative to the intermediate section at a first angle, the second end segment oriented relative to the intermediate section at a second angle, such that the intermediate section is oriented relative to the first chassis panel in a spaced relationship.

17. The system of claim 10, wherein the first chassis panel comprises a first sidewall and a second sidewall, and the second chassis panel comprises a first sidewall and a second sidewall, the first and second sidewalls of one of the first chassis panel or the second chassis panel having a guiding slot, the first and second sidewalls of the other of the first chassis panel or the second chassis panel having a protrusion sized to be receive within the guiding slot to maintain the system in the closed configuration.

* * * * *